United States Patent
Furukawa

(10) Patent No.: US 12,543,563 B2
(45) Date of Patent: Feb. 3, 2026

(54) ELECTRIC APPARATUS

(71) Applicant: DENSO CORPORATION, Kariya (JP)

(72) Inventor: Yasushi Furukawa, Kariya (JP)

(73) Assignee: DENSO CORPORATION, Kariya (JP)

( * ) Notice: Subject to any disclaimer, the term of this patent is extended or adjusted under 35 U.S.C. 154(b) by 195 days.

(21) Appl. No.: 18/322,902

(22) Filed: May 24, 2023

(65) Prior Publication Data

US 2023/0298957 A1    Sep. 21, 2023

Related U.S. Application Data

(63) Continuation of application No. PCT/JP2022/004036, filed on Feb. 2, 2022.

(30) Foreign Application Priority Data

Mar. 3, 2021  (JP) .................... 2021-033794

(51) Int. Cl.
*H01L 23/34* (2006.01)
*H03K 17/082* (2006.01)
*H03K 17/08* (2006.01)

(52) U.S. Cl.
CPC ......... *H01L 23/34* (2013.01); *H03K 17/0822* (2013.01); *H03K 2017/0806* (2013.01); *H03K 2217/0027* (2013.01)

(58) Field of Classification Search
CPC . H01L 23/34; H01L 23/49537; H01L 23/051; H03K 17/082; H03K 17/0822; H03K 2017/0806; H03K 2217/0027

USPC ........................................................ 361/91.3
See application file for complete search history.

(56) References Cited

U.S. PATENT DOCUMENTS

| | | | |
|---|---|---|---|
| 5,719,487 A | 2/1998 | Sato et al. | |
| 2010/0181665 A1* | 7/2010 | Casey | H01L 23/433 257/723 |
| 2014/0035658 A1* | 2/2014 | Usui | H01L 24/40 327/512 |
| 2014/0049870 A1 | 2/2014 | Fujikawa | |
| 2018/0012847 A1 | 1/2018 | Onoda et al. | |
| 2018/0269166 A1 | 9/2018 | Onoda et al. | |
| 2019/0363706 A1 | 11/2019 | Shinomiya et al. | |
| 2020/0126962 A1 | 4/2020 | Kono | |
| 2020/0135702 A1 | 4/2020 | Arai et al. | |
| 2021/0359620 A1* | 11/2021 | Miura | H02H 7/008 |

FOREIGN PATENT DOCUMENTS

| | | |
|---|---|---|
| JP | 2014-096886 A | 5/2014 |
| JP | 2020010369 A | 1/2020 |
| WO | 2013187207 A1 | 12/2013 |

* cited by examiner

*Primary Examiner* — Danny Nguyen
(74) *Attorney, Agent, or Firm* — Posz Law Group, PLC

(57) ABSTRACT

An electric apparatus includes: a first stacked body in which a first semiconductor chip having a first switch is stacked on a first mounting portion; a second stacked body in which a second semiconductor chip having a second switch is stacked on a second mounting portion; a temperature sensor provided in the first stacked body to detect a temperature of the first switch; and a current sensor provided in the second stacked body to detect a current flowing through the second switch. The second stacked body has a heat dissipation property higher than that of the first stacked body.

6 Claims, 15 Drawing Sheets

ELECTRIC APPARATUS

CROSS REFERENCE TO RELATED APPLICATIONS

The present application is a continuation application of International Patent Application No. PCT/JP2022/004036 filed on Feb. 2, 2022, which designated the U.S. and claims the benefit of priority from Japanese Patent Application No. 2021-033794 filed on Mar. 3, 2021. The entire disclosures of all of the above applications are incorporated herein by reference.

TECHNICAL FIELD

The present disclosure relates to an electric apparatus including a semiconductor chip.

BACKGROUND

A power supply device includes semiconductor devices, a substrate on which the semiconductor devices are mounted, and a temperature sensor that detects a temperature of one of the semiconductor devices.

SUMMARY

An electric apparatus includes: a first stacked body in which a first semiconductor chip having a first switch is stacked on a first mounting portion; a second stacked body in which a second semiconductor chip having a second switch is stacked on a second mounting portion; a temperature sensor provided in the first stacked body to detect a temperature of the first switch; and a current sensor provided in the second stacked body to detect a current flowing through the second switch. The second stacked body has a heat dissipation property higher than that of the first stacked body.

DETAILED DESCRIPTION

Figure 1:
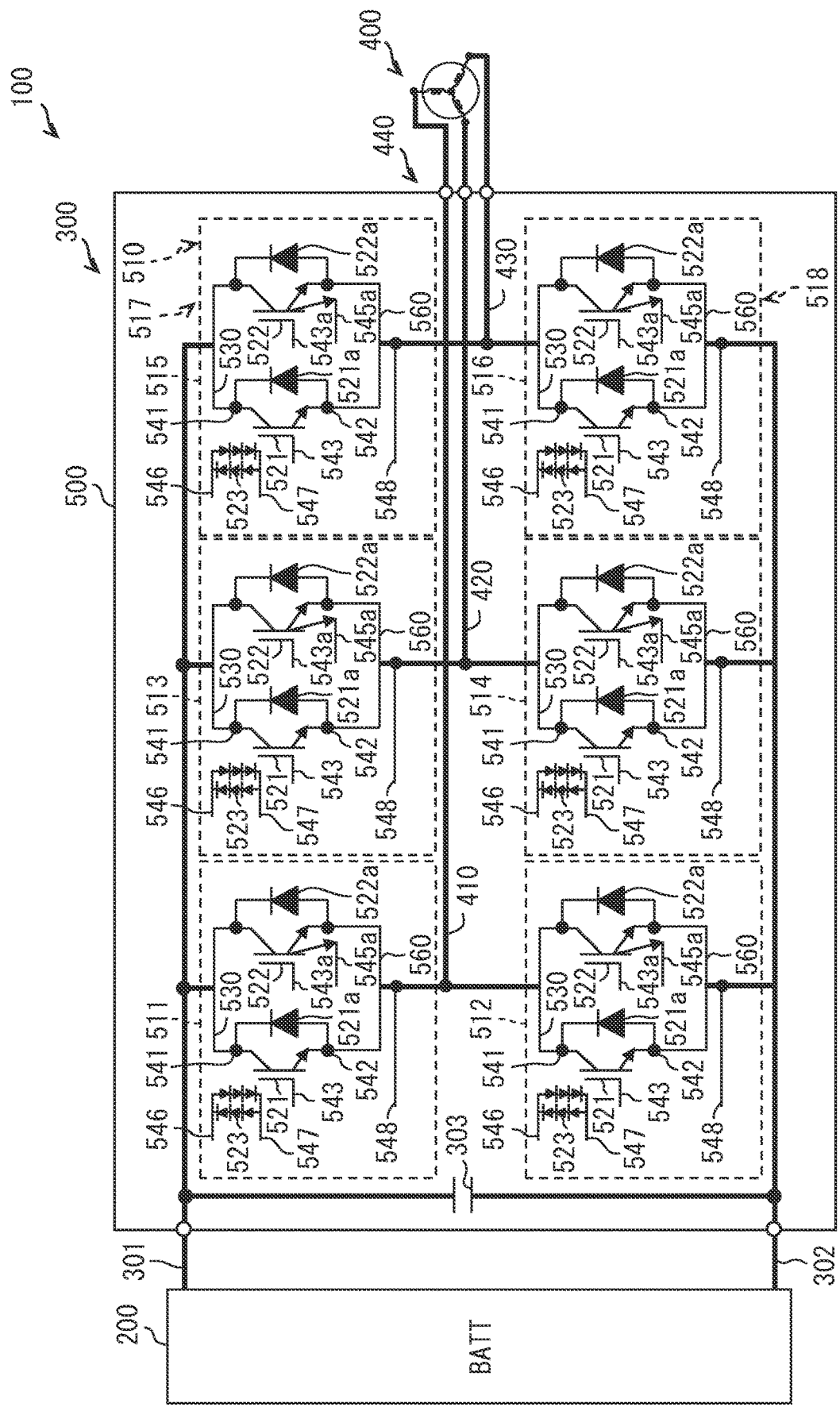
FIG. 1 is a circuit diagram illustrating an in-vehicle system.

A power supply device includes semiconductor devices, a substrate on which the semiconductor devices are mounted, and a temperature sensor that detects a temperature of one of the semiconductor devices.

The substrate includes a thin plate portion and a thick plate portion having a larger thickness than the thin plate portion. One of the semiconductor devices is mounted on the thin plate portion. The rest of the semiconductor devices is mounted on the thick plate portion.

The temperature sensor is provided for the semiconductor device mounted on the thin plate portion. However, there has been no disclosure of a configuration for detecting a physical quantity of the semiconductor device mounted on the thick plate portion.

The present disclosure provides an electric apparatus in which a physical quantity of a second semiconductor chip mounted on a second mounting portion is detected.

An electric apparatus includes: a first stacked body in which a first semiconductor chip having a first switch is stacked on a first mounting portion; a second stacked body in which a second semiconductor chip having a second switch is stacked on a second mounting portion; a temperature sensor provided in the first stacked body to detect a temperature of the first switch; and a current sensor provided in the second stacked body to detect a current flowing through the second switch. The second stacked body has a heat dissipation property higher than that of the first stacked body.

Accordingly, a current amount is detected as a physical quantity of the second semiconductor chip mounted on the second mounting portion.

Embodiments are described for carrying out the present disclosure with reference to the drawings. In each embodiment, parts corresponding to the elements described in the preceding embodiments are denoted by the same reference numerals, and redundant explanation may be omitted. When only a part of a configuration is described in an embodiment, the other preceding embodiments can be applied to the other parts of the configuration.

In addition, not only the combination between portions explicitly described that the combination is possible in each embodiment, but also partial combinations between the embodiments, between the embodiment and the modification, and between the modifications can be made if there is no problem in the combination in particular even when not explicitly described.

Hereinafter, embodiments will be described with reference to the drawings.

First Embodiment

An in-vehicle system 100 for an electric vehicle is described based on FIG. 1. The in-vehicle system 100 includes a battery 200, a power conversion device 300, a motor 400, and a substrate (not illustrated). Electronic control units (ECUs) and a gate driver (not shown) that controls driving of switches based on control signals output from the ECUs are mounted on the substrate.

The ECUs mutually transmit and receive signals to and from the other ECUs mounted in various places of the vehicle. The ECUs control the electric vehicle in cooperation with each other via bus wiring. The regeneration and powering of the motor 400 according to a state of charge (SOC) of the battery 200 are controlled by the ECUs.

The ECU generates a pulse signal as the control signal. The ECU adjusts the on-duty ratio and the frequency of the pulse signal. The on-duty ratio and the frequency are determined based on the output of a sensor (not shown), the target torque of the motor 400, the SOC of the battery 200, and the like.

The battery 200 includes plural secondary batteries. The secondary batteries form a battery stack connected in series. The SOC of the battery stack corresponds to the SOC of the battery 200. As the secondary batteries, a lithium ion secondary battery, a nickel hydrogen secondary battery, an organic radical battery, or the like may be employed.

The power conversion device 300 includes an inverter 500. The inverter 500 of the power conversion device 300 performs power conversion between the battery 200 and the motor 400. The power conversion device 300 converts a DC power of the battery 200 into an AC power. The power conversion device 300 converts an AC power generated by power generation, i.e., regeneration of the motor 400 into a DC power.

The motor 400 is coupled with an output shaft of the electric vehicle which is not shown. The rotational energy of the motor 400 is transmitted to traveling wheels of the electric vehicle via the output shaft. On the contrary, the rotational energy of the traveling wheels is transmitted to the motor 400 via the output shaft.

The motor 400 is electrically driven by the AC power supplied from the power conversion device 300. Accordingly, propulsive force is applied to the traveling wheels. Further, the motor 400 performs regeneration by the rotational energy transmitted from the traveling wheels. The AC power generated by this regeneration is converted into the DC power by the power conversion device 300. This DC power is supplied to the battery 200. The DC power is also supplied to various electric loads mounted on the electric vehicle.

The inverter 500 includes a capacitor 303 and switch modules 510. The first power supply bus bar 301 and the second power supply bus bar 302 are connected to the battery 200. The capacitor 303 and the switch modules 510 are connected in parallel between the first power supply bus bar 301 and the second power supply bus bar 302. The switch modules 510 and the motor 400 are connected via an output bus bar 440. The switch module 510 corresponds to an electric apparatus.

When the motor 400 is powered, each of the high-side switch and the low-side switch included in the switch modules 510 is PWM-controlled by a control signal from the ECU. In this way, three-phase alternating current is generated in the inverter 500. When the motor 400 generates power (i.e., regenerates), the ECU stops outputting of a control signal, for example. As a result, the AC power generated by the power generation of the motor 400 passes through the diode of the switch modules 510 of three phases. As a result, the AC power is converted to the DC power.

Each of the switch modules 510 includes a first switch 521 and a second switch 522. Each of the switch modules 510 includes, in addition to the first switch 521 and the second switch 522, a first diode 521a, a second diode 522a, a temperature sensitive diode 523, a current sensor 545, and a signal terminal 549. The temperature sensitive diode 523 corresponds to a temperature sensor. The current sensor 545 corresponds to a current sensor.

The signal terminal 549 includes a gate terminal 543a, a current sensor terminal 545a, an anode terminal 546, a cathode terminal 547, and a Kelvin emitter terminal 548. The gate terminal 543a and the Kelvin emitter terminal 548 correspond to a common terminal.

The first switch 521, the second switch 522, the first diode 521a, the second diode 522a, the temperature sensitive diode 523, the current sensor 545, and the signal terminal 549 are covered with the coating resin 600 to form the switch module 510.

In the present embodiment, the first diode 521a and the second diode 522a are integrated, as an RCIGBT, to each of the first switch 521 and the second switch 522. The switch and the diode may have a separate structure. Each of the first switch 521 and the second switch 522 is not limited to the IGBT. The first switch 521 and the second switch 522 may be semiconductor element such as MOSFET.

As shown in FIG. 1, the cathode electrode of the first diode 521a is connected to the collector electrode 541 of the first switch 521. The anode electrode of the first diode 521a is connected to the emitter electrode 542 of the first switch 521. The first diode 521a is connected in antiparallel to the first switch 521.

The gate terminal 543a is connected to the gate electrode 543 of the first switch 521.

The temperature sensitive diode 523 is disposed in the first switch 521. The temperature sensitive diode 523 is a temperature sensor for measuring the temperature of the first switch 521. The anode terminal 546 is connected to an anode of the temperature sensitive diode 523. The cathode terminal 547 is connected to the cathode of the temperature sensitive diode 523.

The cathode electrode of the second diode 522a is connected to the collector electrode 541 of the second switch 522. The anode electrode of the second diode 522a is connected to the emitter electrode 542 of the second switch 522. The second diode 522a is connected in antiparallel to the second switch 522.

The gate terminal 543a is connected to the gate electrode 543 of the second switch 522.

The current sensor 545 is connected to the second switch 522. The current sensor 545 is a current sensor for measuring a current flowing through the second switch 522.

The Kelvin emitter terminal 548 is electrically connected to the emitter electrode 542 of the first switch 521 and the emitter electrode 542 of the second switch 522. The Kelvin emitter terminal 548 takes out the potential of the emitter electrode 542 of each of the first switch 521 and the second switch 522.

As shown in FIG. 1, the collector electrode 541 of the first switch 521 and the collector electrode 541 of the second switch 522 are connected via the first conductive portion 530. The emitter electrode 542 of the first switch 521 and the emitter electrode 542 of the second switch 522 are connected via the second conductive portion 560. As a result, the first switch 521 and the second switch 522 are connected in parallel. The first switch 521 and the second switch 522 are simultaneously energized.

In the drawings, an element common to the first switch 521 and the second switch 522 is denoted by giving reference code to either the first switch 521 or the second switch 522.

The switch modules 510 include a high-side switch module 517 located on the high side and a low-side switch module 518 located on the low side.

As shown in FIG. 1, a part of the first conductive portion 530 exposed from the coating resin 600 of the high-side switch module 517 is connected to the first power supply bus bar 301 as a first main terminal.

A part of the second conductive portion 560 exposed from the coating resin 600 of the low-side switch module 518 is connected to the second power supply bus bar 302 as a second main terminal.

A part of the second conductive portion 560 exposed from the coating resin 600 of the high-side switch module 517 is connected to a part of the first conductive portion 530 exposed from the coating resin 600 of the low-side switch module 518.

Thus, the high-side switch module 517 and the low-side switch module 518 are connected in series between the first power supply bus bar 301 and the second power supply bus bar 302.

Further, the output bus bar 440 is connected to a part of the second conductive portion 560 of the high-side switch module 517 and a part of the first conductive portion 530 of the low-side switch module 518.

The high-side switch module 517 includes a first switch module 511, a third switch module 513, and a fifth switch module 515.

The low-side switch module 518 includes a second switch module 512, a fourth switch module 514, and a sixth switch module 516.

The output bus bar 440 includes a U-phase bus bar 410 connected to the U-phase stator coil, a V-phase bus bar 420 connected to the V-phase stator coil, and a W-phase bus bar 430 connected to the W-phase stator coil.

A part of the second conductive portion 560 of the first switch module 511 and a part of the first conductive portion 530 of the second switch module 512 are connected to the U-phase stator coil of the motor 400 via the U-phase bus bar 410.

A part of the second conductive portion 560 of the third switch module 513 and a part of the first conductive portion 530 of the fourth switch module 514 are connected to the V-phase stator coil of the motor 400 via the V-phase bus bar 420.

A part of the second conductive portion 560 of the fifth switch module 515 and a part of the first conductive portion 530 of the sixth switch module 516 are connected to the W-phase stator coil of the motor 400 via the W-phase bus bar 430.

In the following, three directions orthogonal to each other are referred to as x direction, y direction, and z direction. In the drawings, the term "direction" is omitted. The x direction corresponds to a first direction. The y direction corresponds to a second direction. In the drawings, the battery 200 is abbreviated as "BATT".

The switch module 510 includes, in addition to the components described above, a first semiconductor substrate 311, a second semiconductor substrate 321, pads 570, wires 580, a first terminal 591, a second terminal 592, and a solder 700. The solder 700 corresponds to a joining member.

Figure 2:
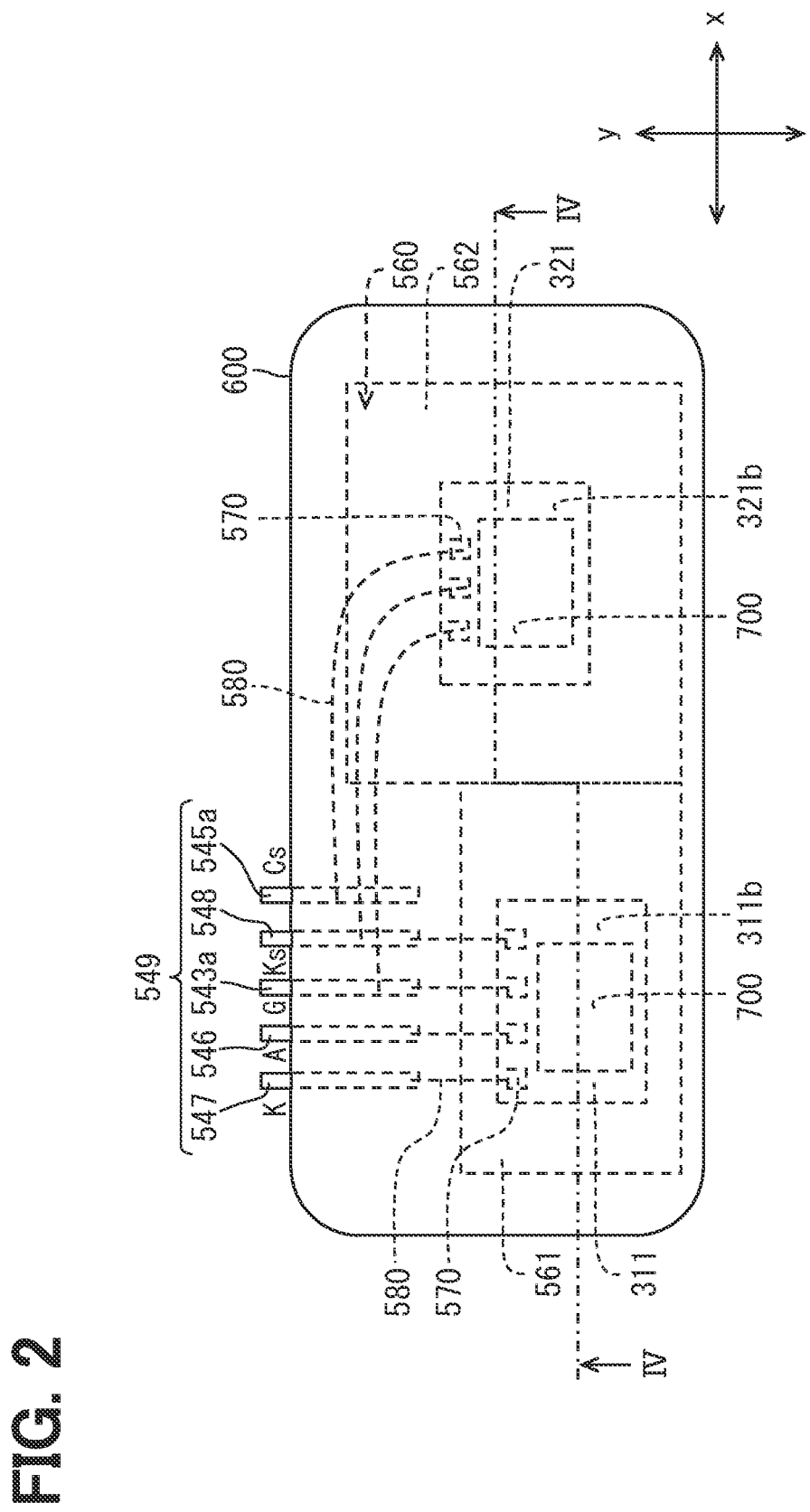
FIG. 2 is a top view illustrating a switch module.
Figure 3:
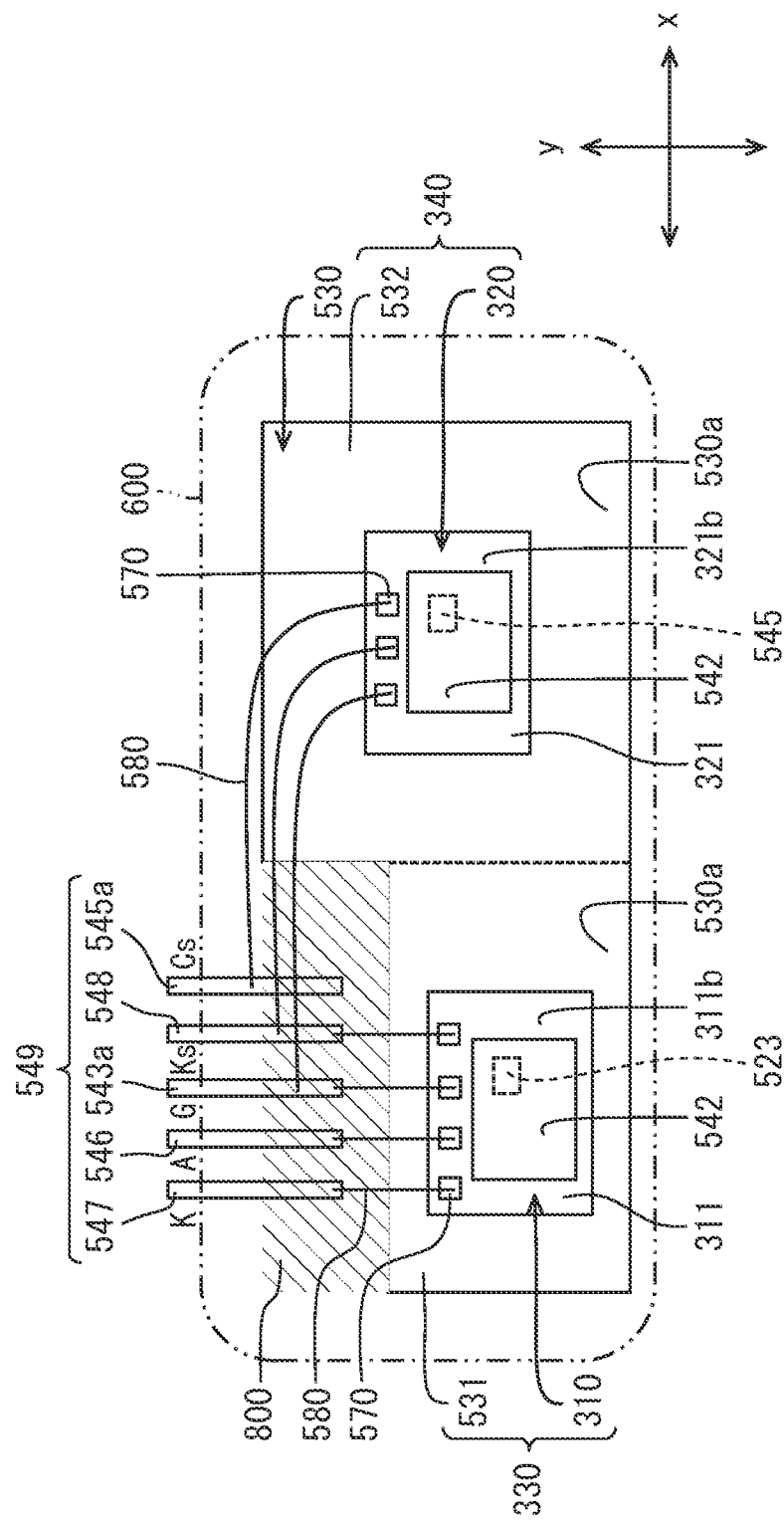
FIG. 3 is a top view of the switch module with some components removed from FIG. 2.
Figure 4:
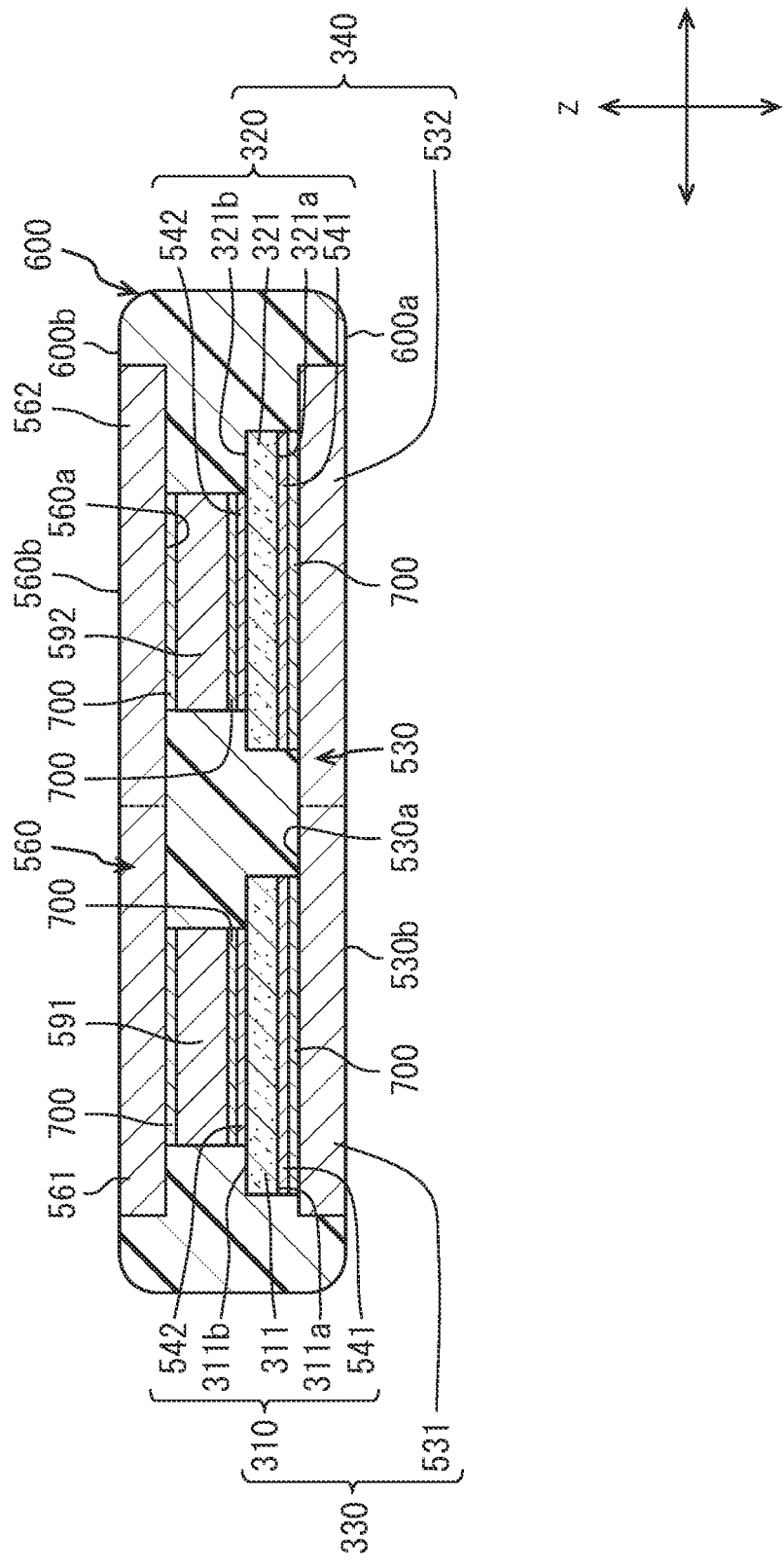
FIG. 4 is a cross-sectional view of the switch module taken along line IV-IV shown in FIG. 2.

FIG. 2 shows a top view of the switch module 510. FIG. 3 is a top view of the switch module 510 in which the coating resin 600, the second conductive portion 560, the first terminal 591, the second terminal 592, and the solder 700 between the second conductive portion 560 and the terminal are omitted from FIG. 2. In FIG. 3, the outline of the coating resin 600 is indicated by a two-dot chain line. The boundary between the first mounting portion 531 and the second mounting portion 532 is indicated by a broken line. The same applies to the drawings described below. FIG. 4 shows a sectional view of the switch module 510 taken along line IV-IV shown in FIG. 2.

The first switch 521, the first diode 521a, and the temperature sensitive diode 523 are formed on the first semiconductor substrate 311. The first semiconductor substrate 311 is formed of silicon, a wide bandgap semiconductor having a wider bandgap than silicon, or the like.

Examples of the wide bandgap semiconductor include silicon carbide, gallium nitride, gallium oxide and diamond. In FIGS. 2 and 3, the temperature sensitive diode 523 is schematically indicated by a broken line.

As shown in FIG. 4, the first semiconductor substrate 311 has a flat shape with a small thickness in the z direction. The first semiconductor substrate 311 has a first substrate surface 311a and a second substrate surface 311b arranged in the z direction.

The collector electrode 541 is provided on the first substrate surface 311a of the first semiconductor substrate 311. The collector electrode 541 is provided on substantially the entire surface of the first substrate surface 311a. The collector electrode 541 also serves as a cathode electrode of the first diode 521a.

The emitter electrode 542 and the gate electrode 543 are provided on the second substrate surface 311b of the first semiconductor substrate 311. The emitter electrode 542 and the gate electrode 543 are provided on a part of the second substrate surface 311b. The emitter electrode 542 also serves as an anode electrode of the first diode 521a. The gate electrode 543 has, for example, a trench gate structure. Although not shown, the gate electrode 543 is embedded in the first semiconductor substrate 311.

As shown in FIG. 2 or 3, the pads 570 having at least four functions are provided on the second substrate surface 311b in addition to the emitter electrode 542 and the gate electrode 543. The four pads 570 are collectively provided at the end of the second substrate surface 311b in the y direction so as to be adjacent to the emitter electrode 542 in the y direction. The pad 570 is an electrode for a signal. The pad 570 is electrically separated from the emitter electrode 542.

Specifically, the four pads 570 include a pad 570 for the gate electrode 543, a pad 570 for the anode of the temperature sensitive diode 523, a pad 570 for the cathode of the temperature sensitive diode 523, and a pad 570 for the Kelvin emitter.

The pad 570 for the gate electrode 543 is connected to the gate terminal 543a via the wire 580. The pad 570 for the anode of the temperature sensitive diode 523 is connected to the anode terminal 546 via the wire 580. The pad 570 for the cathode of the temperature sensitive diode 523 is connected to the cathode terminal 547 via the wire 580. The pad 570 for the Kelvin emitter is connected to the Kelvin emitter terminal 548 via the wire 580.

Hereinafter, the first semiconductor substrate 311, the collector electrode 541, the emitter electrode 542, and the gate electrode 543 are collectively referred to as the first semiconductor chip 310.

The second switch 522, the second diode 522a, and the current sensor 545 are provided on the second semiconductor substrate 321. The second semiconductor substrate 321 is formed of silicon, a wide bandgap semiconductor having a wider bandgap than silicon, or the like.

In FIGS. 2 and 3, the current sensor 545 is schematically indicated by a broken line.

As shown in FIG. 4, the second semiconductor substrate 321 has a flat shape with a small thickness in the z direction.

The second semiconductor substrate 321 has a third substrate surface 321a and a fourth substrate surface 321b arranged in the z direction.

The collector electrode 541 is provided on the third substrate surface 321a of the second semiconductor substrate 321. The collector electrode 541 is provided on substantially the entire surface of the third substrate surface 321a. The collector electrode 541 also serves as a cathode electrode of the second diode 522a.

The emitter electrode 542 and the gate electrode 543 are provided on the fourth substrate surface 321b of the second semiconductor substrate 321. The emitter electrode 542 and the gate electrode 543 are provided on a part of the fourth substrate surface 321b. The emitter electrode 542 also serves as an anode electrode of the second diode 522a. Although not shown, the gate electrode 543 is embedded in the second semiconductor substrate 321.

In addition to the gate electrode 543 and the emitter electrode 542, the pads 570 having at least three functions are provided on the fourth substrate surface 321b. The three pads 570 are collectively provided at the end of the fourth substrate surface 321b in the y direction so as to be adjacent to the emitter electrode 542 in the y direction.

Specifically, the three pads 570 include the pad 570 for the gate electrode 543, the pad 570 for the current sensor 545, and the pad 570 for the Kelvin emitter.

The pad 570 for the gate electrode 543 is connected to the gate terminal 543a via the wire 580. The pad 570 for the current sensor 545 is connected to the current sensor terminal 545a via the wire 580. The pad 570 for the Kelvin emitter is connected to the Kelvin emitter terminal 548 via the wire 580.

As shown in FIGS. 2 and 3, the gate terminal 543a is connected to one of the four pads 570 provided on the first semiconductor substrate 311 and one of the three pads 570 provided on the second semiconductor substrate 321 via different wires 580.

The Kelvin emitter terminal 548 is connected to one of the four pads 570 provided on the first semiconductor substrate 311 and one of the three pads 570 provided on the second semiconductor substrate 321 via different wires 580.

When the wires 580 are connected to the terminal, the wires 580 may not be separately connected to the terminal. The wires 580 may be bundled together at a junction between the terminal and the pad 570. The bundled wires 580 may be electrically connected to the terminals.

Hereinafter, the second semiconductor substrate 321, the collector electrode 541, the emitter electrode 542, and the gate electrode 543 are collectively referred to as the second semiconductor chip 320.

The first conductive portion 530 is made of a metal member containing copper or the like. As shown in FIG. 4, the first conductive portion 530 has a flat shape with a small thickness in the z direction. The first conductive portion 530 has a first conductive mounting surface 530a and a first conductive exposed surface 530b arranged in the z direction. The first conductive exposed surface 530b corresponds to an exposed surface.

As shown in FIGS. 2 and 3, the first conductive portion 530 includes a first mounting portion 531 and a second mounting portion 532 having different areas along the x direction and the y direction. The area of the first conductive mounting surface 530a of the first mounting portion 531 is smaller than the area of the first conductive mounting surface 530a of the second mounting portion 532. The area of the first conductive exposed surface 530b of the first mounting portion 531 is smaller than the area of the first conductive exposed surface 530b of the second mounting portion 532. An area of a plane of the first mounting portion 531 along the x direction and the y direction is smaller than an area of a plane of the second mounting portion 532 along the x direction and the y direction.

The first mounting portion 531 and the second mounting portion 532 are arranged in the x direction. The first mounting portion 531 and the second mounting portion 532 are integrally connected. The forming material of the first mounting portion 531 and the forming material of the second mounting portion 532 are the same.

As shown in FIG. 4, the solder 700 is provided on the first conductive mounting surface 530a of the first mounting portion 531. The first semiconductor chip 310 is mounted on the first mounting portion 531 in such a manner that the collector electrode 541 is in contact with the solder 700. Further, the solder 700 is provided on the emitter electrode 542 of the first semiconductor chip 310.

Similarly, the solder 700 is provided on the first conductive mounting surface 530a of the second mounting portion 532. The second semiconductor chip 320 is mounted on the second mounting portion 532 in such a manner that the collector electrode 541 is in contact with the solder 700. Further, the solder 700 is provided on the emitter electrode 542 of the second semiconductor chip 320.

The first terminal 591 is a block body formed of a forming material including a metal such as copper.

The first terminal 591 is mounted on the first semiconductor chip 310 so as to be in contact with the solder 700 provided on the emitter electrode 542 of the first semiconductor chip 310. Further, the solder 700 is provided at a portion of the first terminal 591 away from the first semiconductor chip 310 in the z direction.

The second terminal 592 is a block body formed of a forming material including a metal such as copper.

The second terminal 592 is mounted on the second semiconductor chip 320 so as to be in contact with the solder 700 provided on the emitter electrode 542 of the second semiconductor chip 320. Further, the solder 700 is provided at a portion of the second terminal 592 away from the second semiconductor chip 320 in the z direction.

The second conductive portion 560 is made of a metal member containing copper or the like. As shown in FIG. 4, the second conductive portion 560 has a flat shape with a small thickness in the z direction. The second conductive portion 560 has a second conductive mounting surface 560a and a second conductive exposed surface 560b arranged in the z direction.

The second conductive portion 560 includes a third mounting portion 561 and a fourth mounting portion 562 having different areas along the x direction and the y direction. The third mounting portion 561 has the same shape as the first mounting portion 531. The fourth mounting portion 562 has the same shape as the second mounting portion 532.

The area of the second conductive mounting surface 560a of the third mounting portion 561 is smaller than the area of the second conductive mounting surface 560a of the fourth mounting portion 562. The area of the second conductive exposed surface 560b of the third mounting portion 561 is smaller than the area of the second conductive exposed surface 560b of the fourth mounting portion 562.

The area of the second conductive mounting surface 560a of the third mounting portion 561 may be equal to the area of the second conductive mounting surface 560a of the fourth mounting portion 562. The area of the second conductive exposed surface 560b of the third mounting portion

561 may be equal to the area of the second conductive exposed surface 560b of the fourth mounting portion 562.

The third mounting portion 561 and the fourth mounting portion 562 are arranged in the x direction. The third mounting portion 561 and the fourth mounting portion 562 are integrally connected. The forming material of the third mounting portion 561 and the forming material of the fourth mounting portion 562 are the same.

The second conductive portion 560 is mounted on the first terminal 591 and the second terminal 592 so as to be in contact with the solder 700 provided on the first terminal 591 and the solder 700 provided on the second terminal 592.

More specifically, the third mounting portion 561 is mounted on the first terminal 591 so as to be in contact with the solder 700 provided at the portion of the first terminal 591 away from the first semiconductor chip 310 in the z direction.

The fourth mounting portion 562 is mounted on the second terminal 592 so as to be in contact with the solder 700 provided at the portion of the second terminal 592 away from the second semiconductor chip 320 in the z direction.

The coating resin 600 is made of material such as an epoxy resin. The coating resin 600 is molded by a transfer molding method. The coating resin 600 covers a part of the constituent elements described above.

As shown in FIG. 4, the coating resin 600 has a substantially rectangular shape. The coating resin 600 has a first main surface 600a, a second main surface 600b, and four connection surfaces connecting the first main surface 600a and the second main surface 600b, which are arranged in the z direction.

The first conductive exposed surface 530b of the first mounting portion 531 and the first conductive exposed surface 530b of the second mounting portion 532 are exposed from the first main surface 600a.

The second conductive exposed surface 560b of the third mounting portion 561 and the second conductive exposed surface 560b of the fourth mounting portion 562 are exposed from the second main surface 600b.

A part of the signal terminal 549 is exposed from one of the four connection surfaces. The signal terminal 549 exposed from the connection surface extends toward the substrate. The signal terminal 549 is electrically connected to a gate driver or an ECU mounted on the substrate.

The first switch 521 is formed on the first semiconductor substrate 311. The second switch 522 is formed on the second semiconductor substrate 321. An IGBT is applied to each of the first switch 521 and the second switch 522.

As shown in FIG. 4, the thickness of the first semiconductor substrate 311 in the z direction is equal to the thickness of the second semiconductor substrate 321 in the z direction.

As shown in FIGS. 2 to 4, the area of the first substrate surface 311a of the first semiconductor substrate 311 is equal to the area of the third substrate surface 321a of the second semiconductor substrate 321. The area of the second substrate surface 311b of the first semiconductor substrate 311 is equal to the area the area of the fourth substrate surface 321b of the second semiconductor substrate 321. An area of a plane of the first semiconductor substrate 311 along the x direction and the y direction is equal to an area of a plane of the second semiconductor substrate 321 along the x direction and the y direction.

The number of the first switches 521 formed on the first semiconductor substrate 311 is equal to the number of the second switches 522 formed on the second semiconductor substrate 321. The number of the first switches 521 provided in the first semiconductor chip 310 is equal to the number of the second switches 522 provided in the second semiconductor chip 320.

As described above, the area of a plane of the first mounting portion 531 along the x direction and the y direction is smaller than the area of a plane of the second mounting portion 532 along the x direction and the y direction.

Therefore, as shown in FIG. 3, an overlapping region 800 in which a projection region of the first mounting portion 531 projected in the y direction and a projection region of the second mounting portion 532 projected in the x direction overlap each other is a gap. The signal terminal 549 is provided in the overlapping region 800.

The signal terminal 549 includes the gate terminal 543a and the Kelvin emitter terminal 548 which are commonly connected to the first semiconductor chip 310 and the second semiconductor chip 320. In the drawings, the overlapping region 800 is indicated by hatching.

As described above, the thickness of the first mounting portion 531 in the z direction is equal to the thickness of the second mounting portion 532 in the z direction. An area of a plane of the first mounting portion 531 along the x direction and the y direction is smaller than an area of a plane of the second mounting portion 532 along the x direction and the y direction. That is, it can be said that the volume of the first mounting portion 531 is smaller than the volume of the second mounting portion 532.

As described above, the number of the first switches 521 formed on the first semiconductor substrate 311 is equal to the number of the second switches 522 formed on the second semiconductor substrate 321.

The heat dissipation from the second semiconductor chip 320 to the second mounting portion 532 is higher than the heat dissipation from the first semiconductor chip 310 to the first mounting portion 531. The first semiconductor chip 310 is less likely to dissipate heat than the second semiconductor chip 320 is.

In other words, the heat dissipation of the second stacked body 340 in which the second semiconductor chip 320 is mounted on the second mounting portion 532 is higher than the heat dissipation of the first stacked body 330 in which the first semiconductor chip 310 is mounted on the first mounting portion 531. The first stacked body 330 is less likely to dissipate heat than the second stacked body 340 is.

As described above, the temperature sensitive diode 523 that measures a temperature of the first switch 521 is provided on the first semiconductor substrate 311. The current sensor 545 that measures a current flowing through the second switch 522 is provided on the second semiconductor substrate 321.

Accordingly, the current sensor 545 that measures a current flowing through the second switch 522 as a physical quantity of the second semiconductor chip 320 is mounted on the second stacked body 340.

The first switch 521 and the second switch 522 are connected in parallel. The first switch 521 and the second switch 522 are simultaneously energized.

The heat dissipation from the second semiconductor chip 320 to the second mounting portion 532 is higher than the heat dissipation from the first semiconductor chip 310 to the first mounting portion 531. The temperature of the first semiconductor chip 310 is likely to be higher than the temperature of the second semiconductor chip 320.

Therefore, the temperature of the first switch 521 is likely to be higher than the temperature of the second switch 522. Accordingly, the on-resistance of the first switch 521 tends to be higher than the on-resistance of the second switch 522. The on-resistance of the second switch 522 is likely to be lower than the on-resistance of the first switch 521. Therefore, the current flows more easily to the second switch 522 than to the first switch 521.

Accordingly, the temperature of the second switch 522 can be estimated based on the temperature of the first switch 521. The value of current flowing through the first switch 521 can be estimated based on the value of current flowing through the second switch 522. In this way, it is effective to detect the amount of current flowing through the second switch 522 instead of the current flowing through the first switch 521.

In other words, the temperature of the second semiconductor chip 320 can be estimated based on the temperature of the first semiconductor chip 310. The value of current flowing through the first semiconductor chip 310 can be estimated based on the value of current flowing through the second semiconductor chip 320.

As described above, ECUs and a gate driver (not shown) that controls driving of switches based on signals from the ECUs are mounted on the substrate. The signal terminal 549 is electrically connected to the gate driver and the ECU. Therefore, the driving of the first switch 521 and the second switch 522 is controlled based on the detection result of the temperature sensitive diode 523 and the detection result of the current sensor 545.

Accordingly, it is possible to limit the driving of the first switch 521 and the second switch 522 before the temperatures of the first switch 521 and the second switch 522 become excessively high. The drive of the first switch 521 and the second switch 522 can be restricted before an overcurrent flows through the first switch 521 and the second switch 522. The protection function of the inverter 500 is enhanced.

The signal terminal 549 is provided in the overlapping region 800 where the projection region of the first mounting portion 531 in the y direction and the projection region of the second mounting portion 532 in the x direction overlap each other. This reduces the size of the switch module 510 in the x direction.

As described above, the signal terminal 549 includes the gate terminal 543a and the Kelvin emitter terminal 548 which are commonly connected to the first semiconductor chip 310 and the second semiconductor chip 320. This suppresses an increase in the number of the signal terminals 549. An increase in the number of components is suppressed.

First Modification

Figure 5:
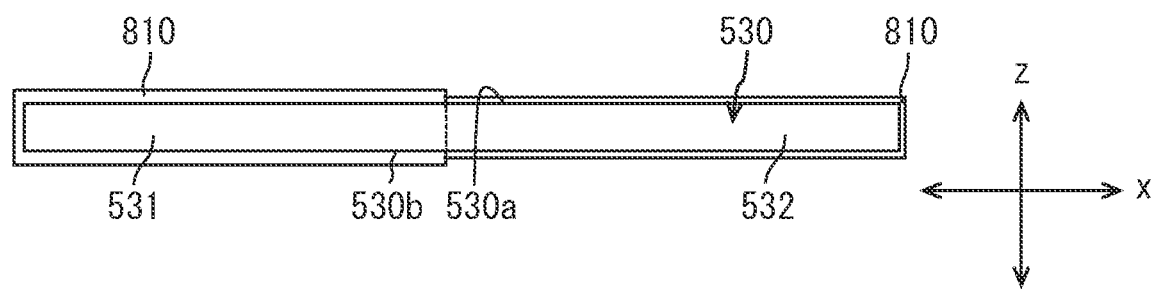
FIG. 5 is a sectional view illustrating a modification of the switch module.

As shown in FIG. 5, a plating 810 containing nickel having a thermal conductivity lower than that of copper is applied to the surface including the first conductive mounting surface 530a and the first conductive mounting surface 530a of each of the first mounting portion 531 and the second mounting portion 532. The thickness of the plating 810 applied to the surface of the second mounting portion 532 may be smaller than the thickness of the plating 810 applied to the surface of the first mounting portion 531.

Second Modification

Figure 6:
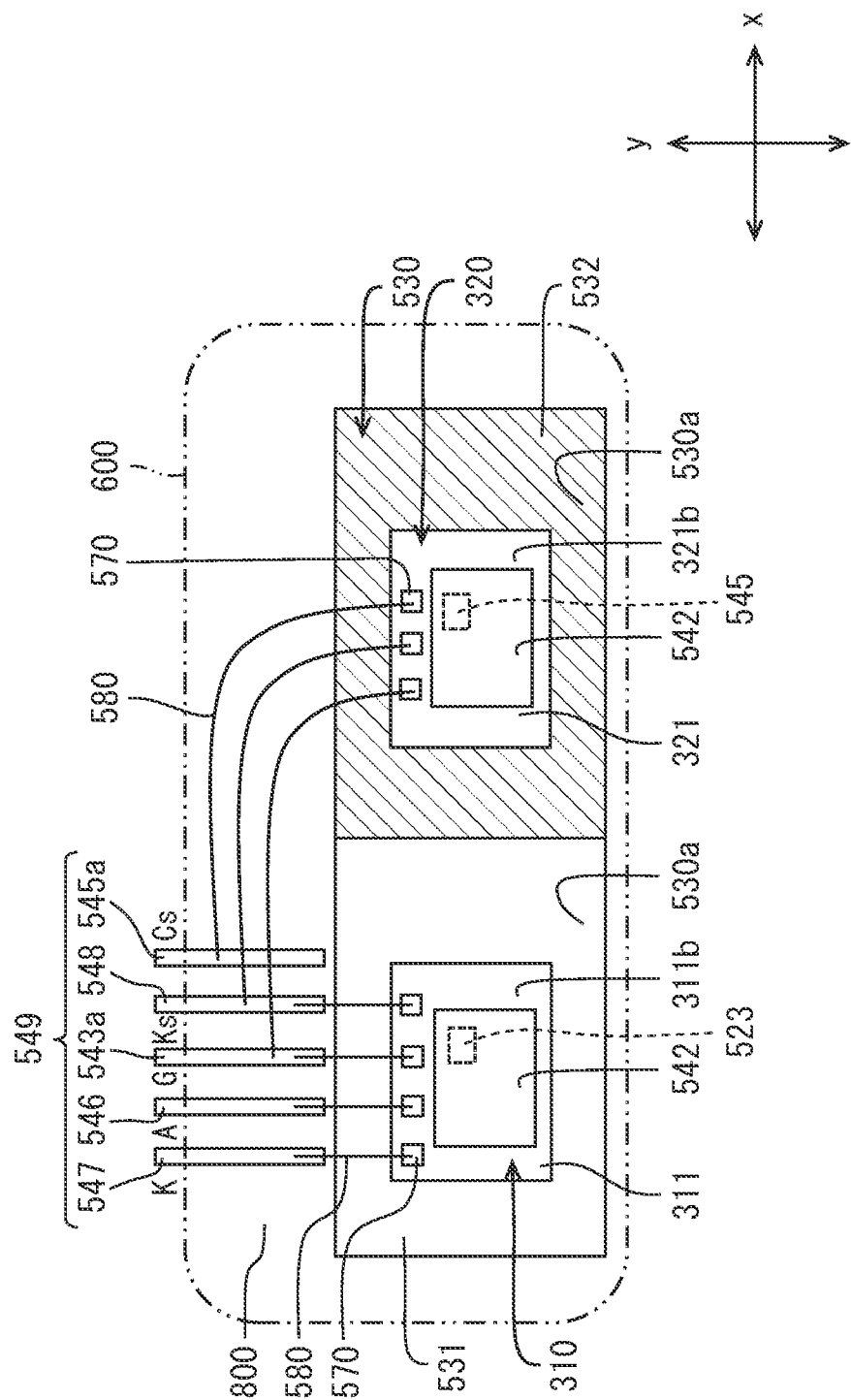
FIG. 6 is a top view illustrating a modification of the switch module.

As shown in FIG. 6, the area of a plane of the first mounting portion 531 along the x direction and the y direction may be equal to the area of a plane of the second mounting portion 532 along the x direction and the y direction.

In this case, at least a part of the second mounting portion 532 may include a different material having a higher thermal conductivity than the material forming the first mounting portion 531. In FIG. 6, the difference between the materials for forming the first mounting portion 531 and the second mounting portion 532 is indicated by a difference in hatching.

Third Modification

Figure 7:
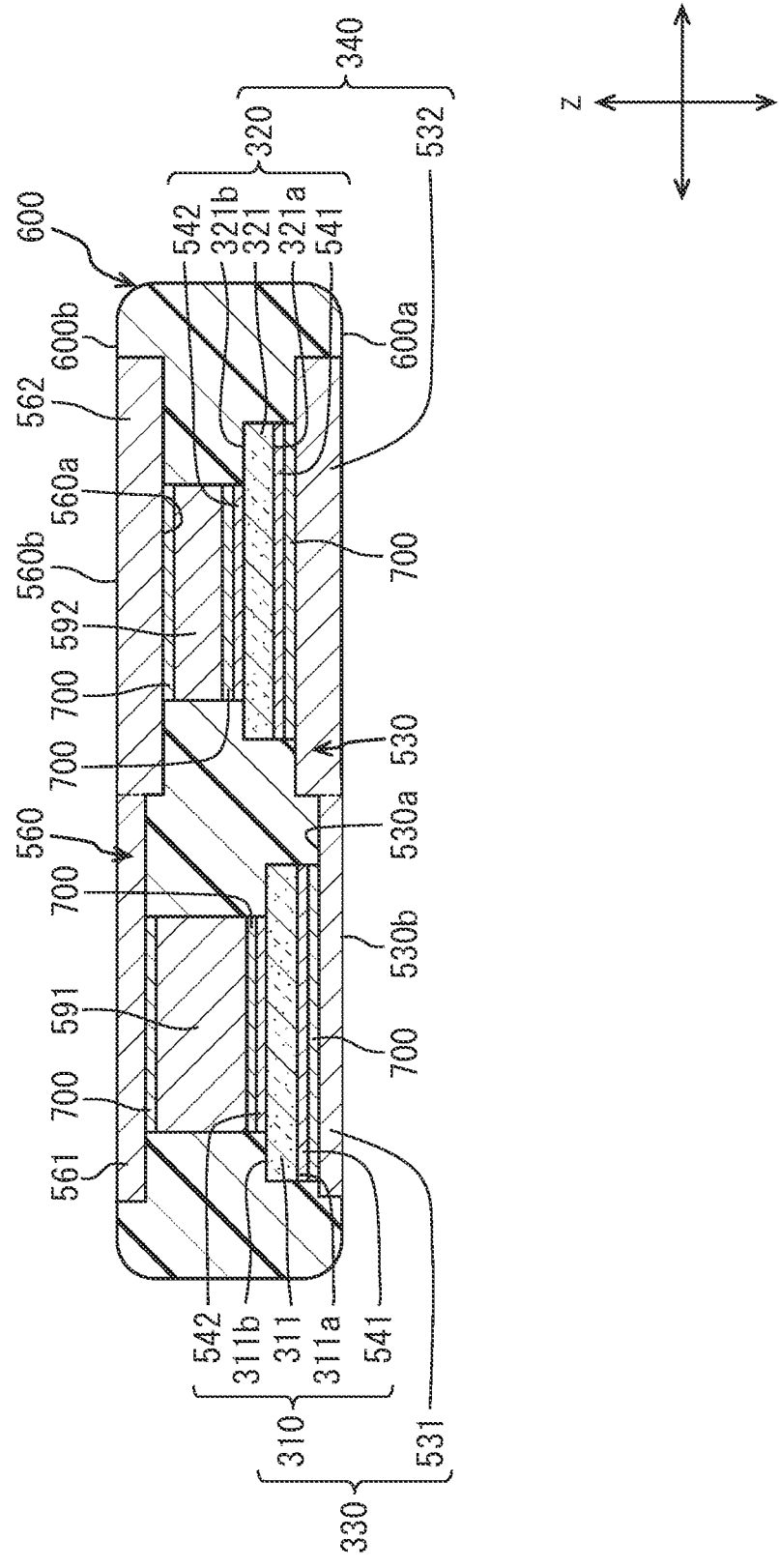
FIG. 7 is a sectional view illustrating a modification of the switch module.

As shown in FIG. 7, the thickness of the second mounting portion 532 in the z direction may be larger than the thickness of the first mounting portion 531 in the z direction. Further, the thickness of the fourth mounting portion 562 in the z direction may be larger than the thickness of the third mounting portion 561 in the z direction.

Fourth Modification

Figure 8:
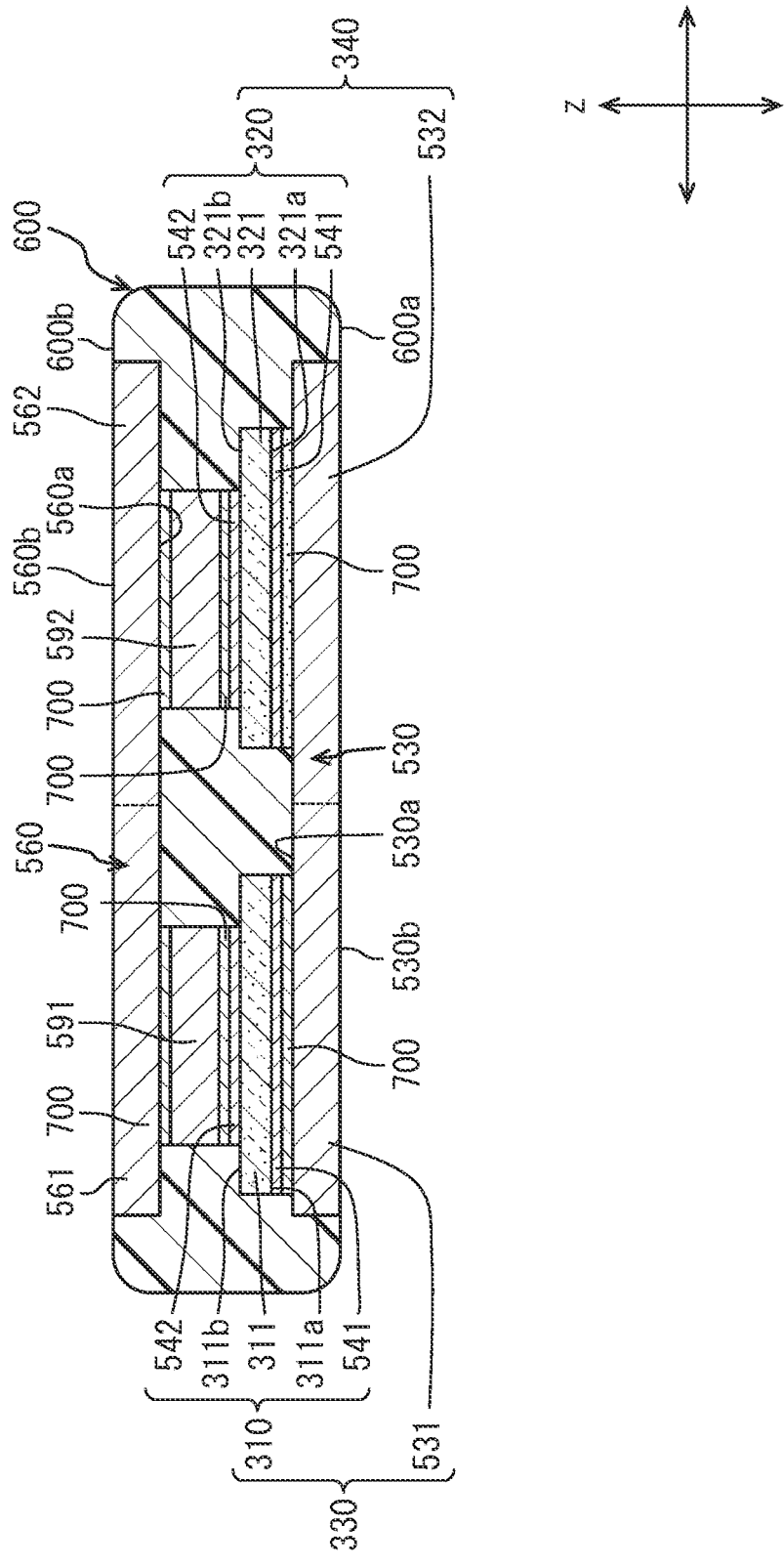
FIG. 8 is a sectional view illustrating a modification of the switch module.

As shown in FIG. 8, at least a part of the solder 700 provided between the second semiconductor chip 320 and the second mounting portion 532 may include a different material having higher thermal conductivity than the solder 700 provided between the first semiconductor chip 310 and the first mounting portion 531.

In FIG. 8, the difference between the solder 700 provided between the first semiconductor chip 310 and the first mounting portion 531 and the solder 700 provided between the second semiconductor chip 320 and the second mounting portion 532 is indicated by a difference in hatching.

Fifth Modification

Figure 9:
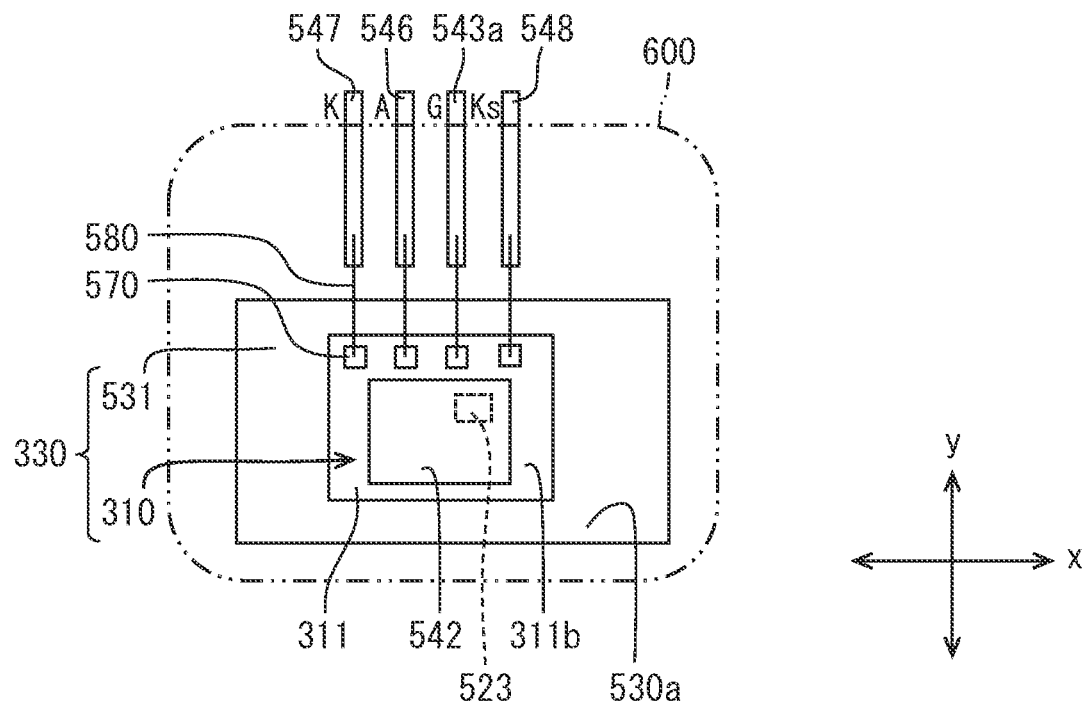
FIG. 9 is a top view illustrating a modification of the switch module.
Figure 10:
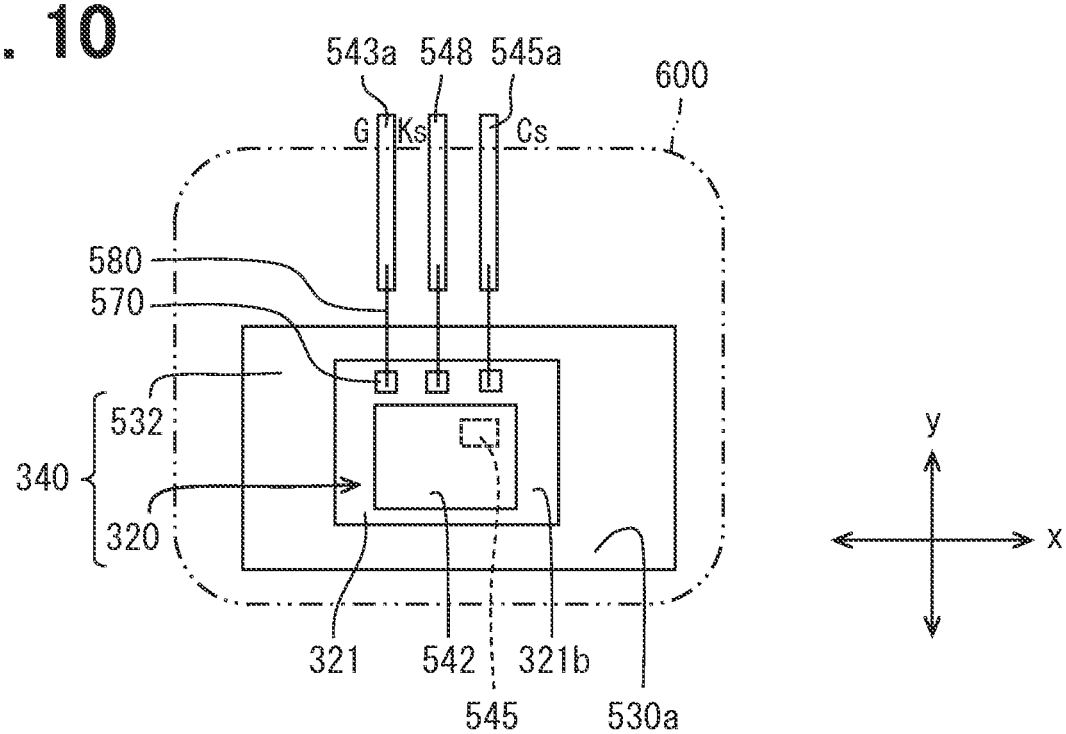
FIG. 10 is a top view illustrating a modification of the switch module.

As shown in FIGS. 9 and 10, the first stacked body 330 and the second stacked body 340 may be coated with different coating resins 600. The electrical connection between the first switch 521 and the second switch 522 is shown in FIG. 11.

Figure 11:
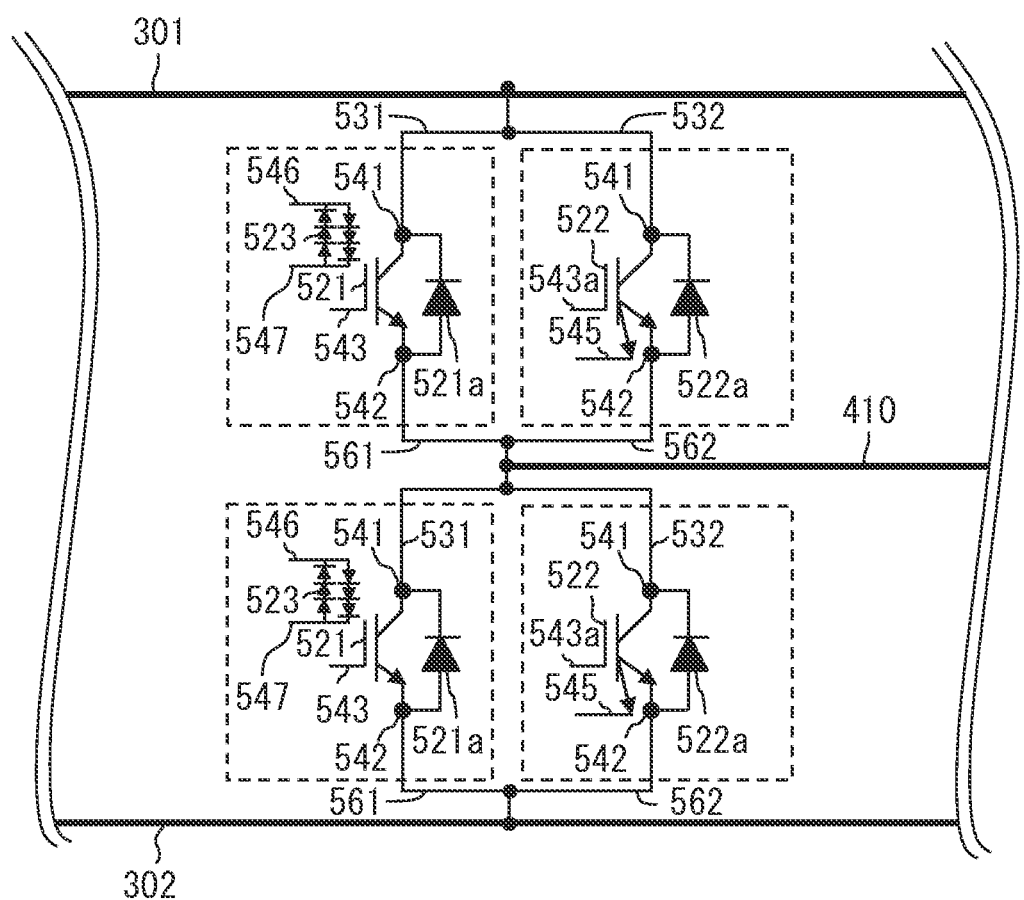
FIG. 11 is a circuit diagram illustrating a modification of the in-vehicle system.

As shown in FIG. 11, the collector electrode 541 of the first switch 521 is electrically and mechanically connected to the collector electrode 541 of the second switch 522 via the first mounting portion 531 and the second mounting portion 532. Similarly, the emitter electrode 542 of the first switch 521 is electrically and mechanically connected to the emitter electrode 542 of the second switch 522 via the third mounting portion 561 and the fourth mounting portion 562.

Sixth Modification

Figure 12:
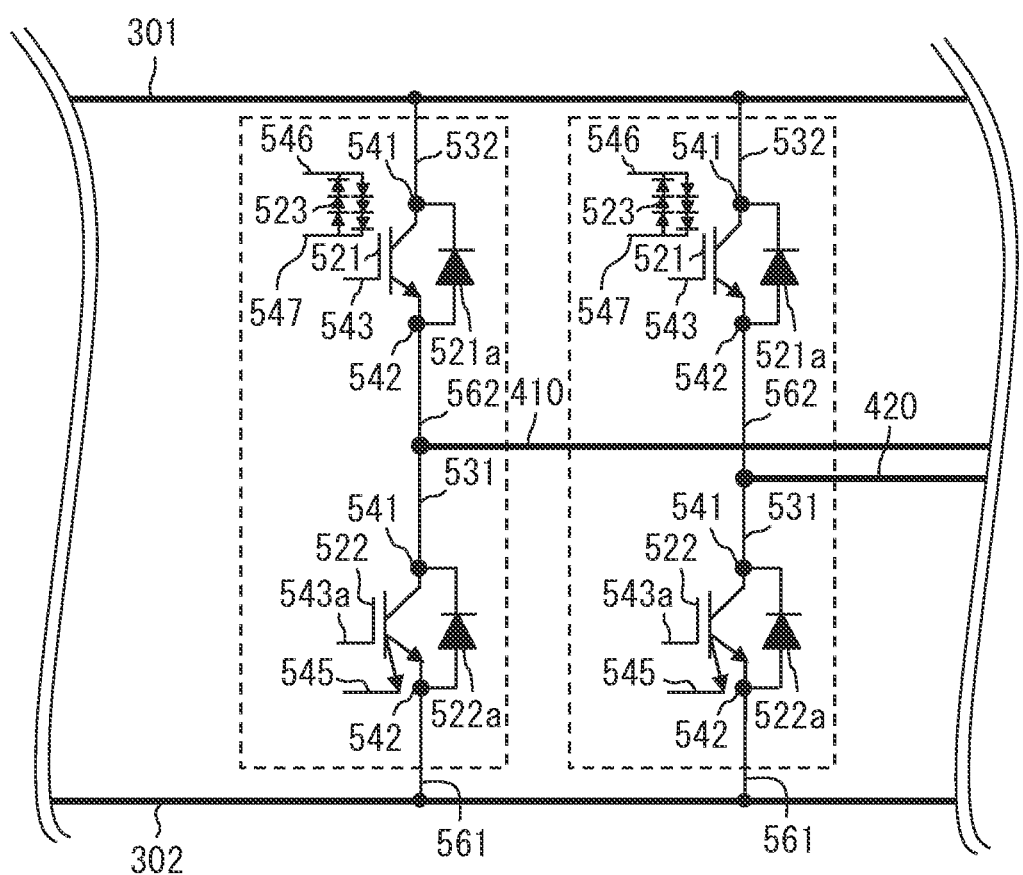
FIG. 12 is a circuit diagram illustrating a modification of the in-vehicle system.
Figure 13:
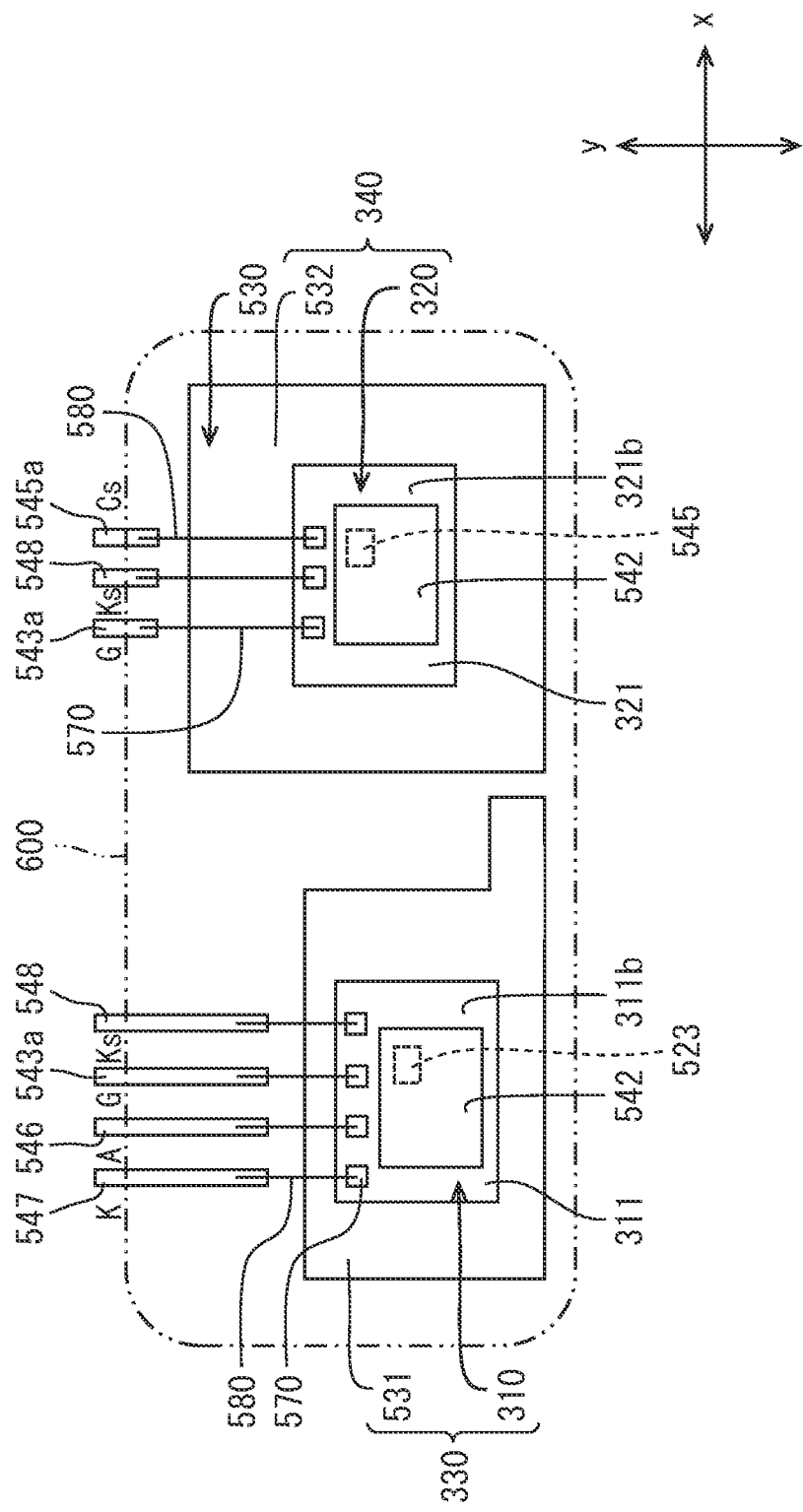
FIG. 13 is a top view illustrating a modification of the switch module.

As shown in FIG. 12, the first switch 521 and the second switch 522 may be connected in series. In this case, as shown in FIG. 13, the first mounting portion 531 and the second mounting portion 532 are separate bodies.

Figure 14:
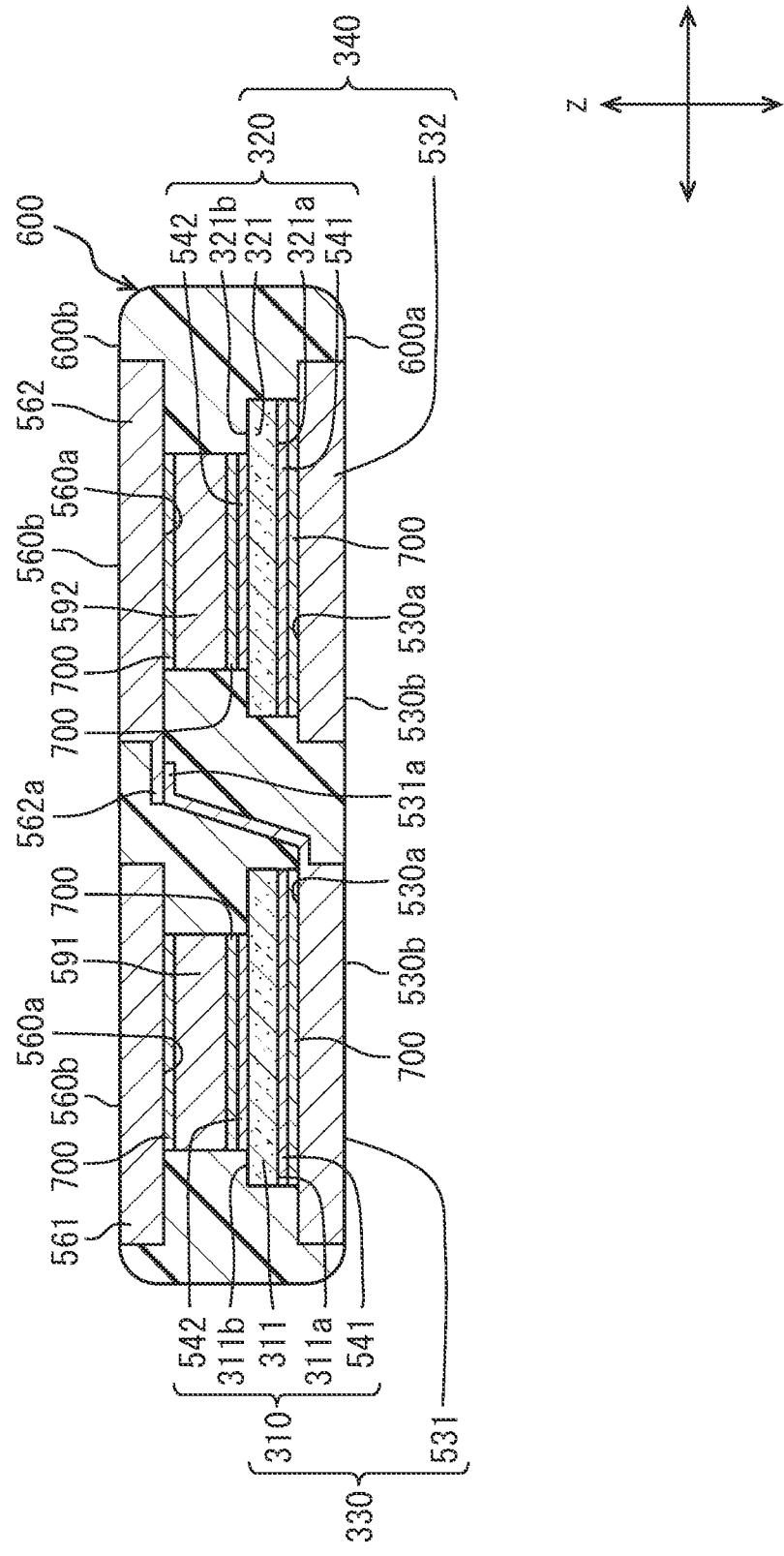
FIG. 14 is a sectional view illustrating a modification of the switch module.

As shown in FIG. 14, the first mounting portion 531 has a first joint 531a extending toward the fourth mounting portion 562. The fourth mounting portion 562 includes a second joint 562a extending toward the third mounting portion 561 and connected to the first joint 531a. The first joint 531a and the second joint 562a are electrically and mechanically connected to each other via the solder 700. Thus, the first semiconductor chip 310 and the second semiconductor chip 320 are electrically connected to each other.

The collector electrode 541 of the first switch 521 is electrically and mechanically connected to the first power supply bus bar 301 via the second mounting portion 532. The emitter electrode 542 of the second switch 522 is electrically and mechanically connected to the second power supply bus bar 302 via the third mounting portion 561.

Seventh Modification

Figure 15:
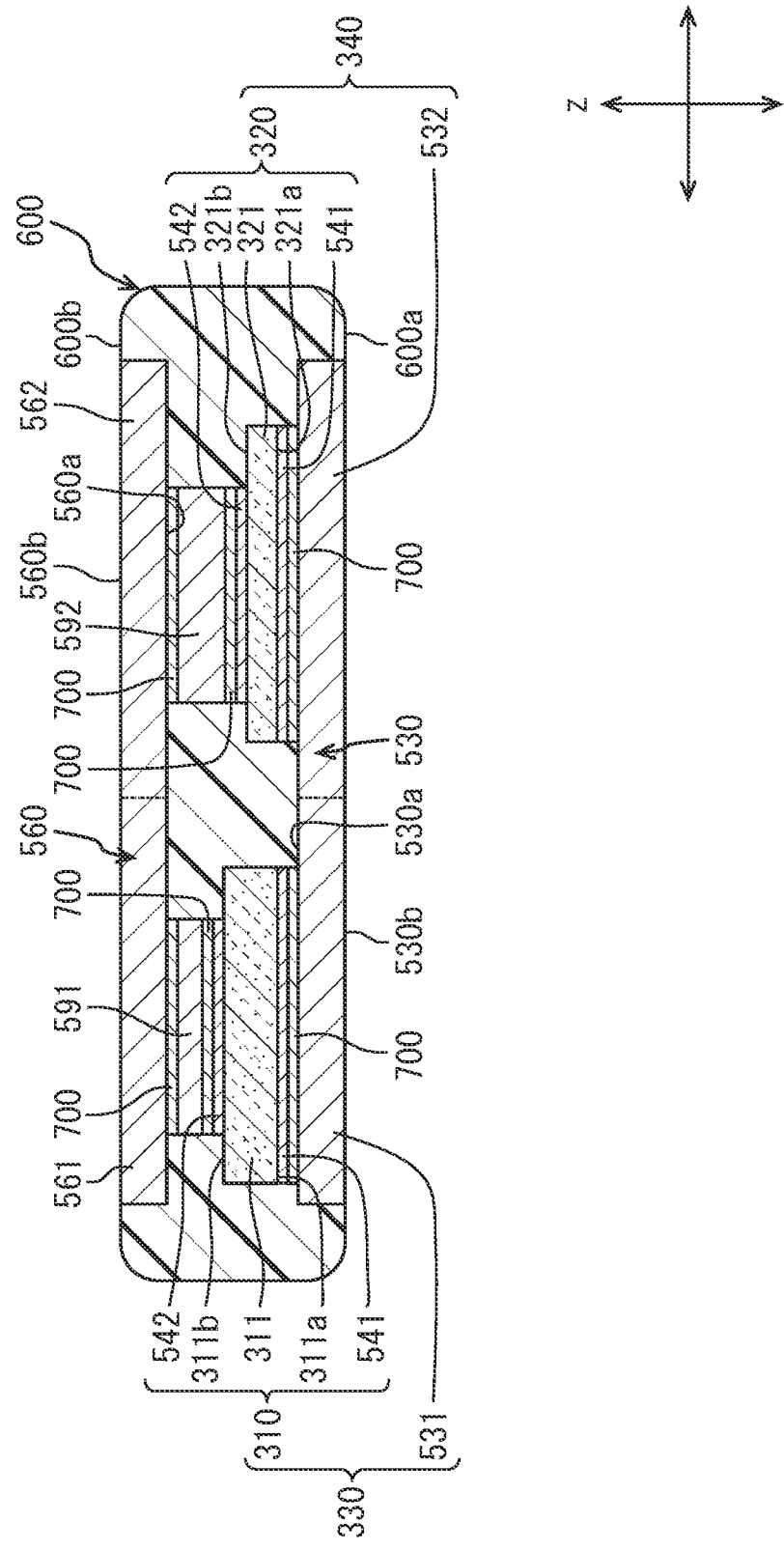
FIG. 15 is a sectional view illustrating a modification of the switch module.

As shown in FIG. 15, the thickness of the first semiconductor chip 310 in the z direction may be larger than the thickness of the second semiconductor chip 320 in the z direction. In this case, the on-resistance of the first semiconductor chip 310 is higher than the on-resistance of the second semiconductor chip 320 in a state where the first semiconductor chip 310 and the second semiconductor chip 320 are not energized.

Therefore, when the first semiconductor chip 310 and the second semiconductor chip 320 are simultaneously energized, the temperature of the first semiconductor chip 310 is likely to be higher than the temperature of the second semiconductor chip 320.

The temperature of the second semiconductor chip 320 can be estimated based on the temperature of the first semiconductor chip 310. The value of the current flowing through the first semiconductor chip 310 can be estimated based on the value of the current flowing through the second semiconductor chip 320.

Eighth Modification

Figure 16:
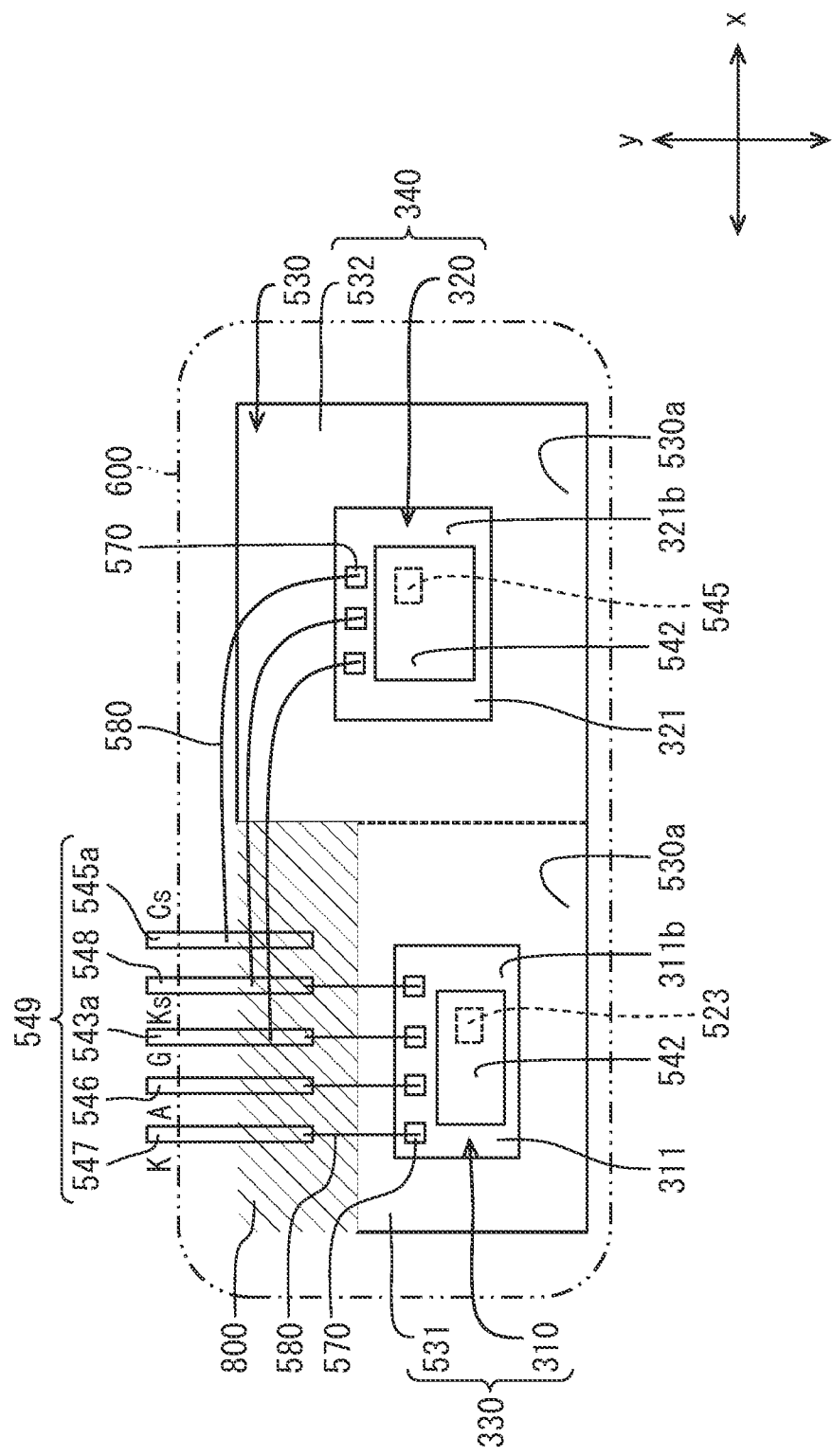
FIG. 16 is a top view illustrating a modification of the switch module.

As shown in FIG. 16, the area of a plane of the first semiconductor chip 310 along the x direction and the y direction may be smaller than the area of a plane of the second semiconductor chip 320 along the x direction and the y direction.

In this case, the on-resistance of the first semiconductor chip 310 is higher than the on-resistance of the second semiconductor chip 320 in a state where the first semiconductor chip 310 and the second semiconductor chip 320 are not energized.

Therefore, when the first semiconductor chip 310 and the second semiconductor chip 320 are simultaneously energized, the temperature of the first semiconductor chip 310 is likely to be higher than the temperature of the second semiconductor chip 320.

The temperature of the second semiconductor chip 320 can be estimated based on the temperature of the first semiconductor chip 310. The value of the current flowing through the first semiconductor chip 310 can be estimated based on the value of the current flowing through the second semiconductor chip 320.

Other Modifications

The semiconductor chips included in the switch module 510 are not limited to the first semiconductor chip 310 and the second semiconductor chip 320. The switch module 510 may include another semiconductor chip in addition to the first semiconductor chip 310 and the second semiconductor chip 320. In this case, the temperature sensitive diode 523 may not be provided in another semiconductor chip. The current sensor 545 may not be provided in another semiconductor chip.

As another example, the semiconductor element applied to the first switch 521 may be different from the semiconductor element applied to the second switch 522.

What is claimed is:

1. An electric apparatus comprising:
a first stacked body in which a first semiconductor chip having a first switch is stacked on a first mounting portion;
a second stacked body in which a second semiconductor chip having a second switch is stacked on a second mounting portion, the second stacked body having higher heat dissipation than the first stacked body;
a temperature sensor provided in the first stacked body to detect a temperature of the first switch;
a current sensor provided in the second stacked body to detect a current flowing through the second switch;
a signal terminal connected to the first switch and the second switch; and
a coating resin that coats the first stacked body, the second stacked body, and the signal terminal,
wherein
a material of the first mounting portion is the same as a material of the second mounting portion,
a volume of the first mounting portion is smaller than a volume of the second mounting portion,
each of the first mounting portion and the second mounting portion has an exposed surface exposed from the coating resin, a first direction being defined along the exposed surface, a second direction being defined along the exposed surface and orthogonal to the first direction,
the first stacked body and the second stacked body are arranged in the first direction,
an overlapping region is defined in which a projection region of the first mounting portion projected in the second direction overlaps with a projection region of the second mounting portion projected in the first direction, and
a part of the signal terminal is located in the overlapping region.

2. The electric apparatus according to claim 1, wherein the first switch and the second switch are connected in parallel.

3. The electric apparatus according to claim 1, wherein the signal terminal includes a common terminal electrically connected to each of the first switch and the second switch.

4. The electric apparatus according to claim 1,
wherein
at least a part of the second mounting portion includes a different material different from a material of the first mounting portion, and
a thermal conductivity of the second mounting portion is higher than a thermal conductivity of the first mounting portion.

5. An electric apparatus comprising:
a first stacked body in which a first semiconductor chip having a first switch is stacked on a first mounting portion;
a second stacked body in which a second semiconductor chip having a second switch is stacked on a second mounting portion, the second stacked body having higher heat dissipation than the first stacked body;
a temperature sensor provided in the first stacked body to detect a temperature of the first switch;
a current sensor provided in the second stacked body to detect a current flowing through the second switch;
a first joining member provided between the first semiconductor chip and the first mounting portion to join the first semiconductor chip and the first mounting portion; and a second joining member provided between the second semiconductor chip and the second mounting portion to join the second semiconductor chip and the second mounting portion,
wherein
at least a part of the second joining member includes a different material having a thermal conductivity higher than that of the first joining member.

6. The electric apparatus according to claim 1, wherein an on-resistance of the first semiconductor chip is higher than an on-resistance of the second semiconductor chip.

* * * * *